United States Patent
Noh et al.

(10) Patent No.: US 11,626,380 B2
(45) Date of Patent: Apr. 11, 2023

(54) SEMICONDUCTOR PACKAGE

(71) Applicant: Samsung Electronics Co., Ltd., Suwon-si (KR)

(72) Inventors: Hyunjun Noh, Cheonan-si (KR); Keunho Choi, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 198 days.

(21) Appl. No.: 17/137,750

(22) Filed: Dec. 30, 2020

(65) Prior Publication Data

US 2021/0407956 A1 Dec. 30, 2021

(30) Foreign Application Priority Data

Jun. 25, 2020 (KR) .................. 10-2020-0078046

(51) Int. Cl.
| | |
|---|---|
| H01L 23/00 | (2006.01) |
| H01L 27/11519 | (2017.01) |
| H01L 27/11524 | (2017.01) |
| H01L 27/11529 | (2017.01) |
| H01L 27/11556 | (2017.01) |
| H01L 27/11565 | (2017.01) |
| H01L 27/11573 | (2017.01) |
| H01L 27/11582 | (2017.01) |
| H01L 25/18 | (2023.01) |
| H01L 27/1157 | (2017.01) |

(52) U.S. Cl.
CPC .............. *H01L 24/45* (2013.01); *H01L 24/05* (2013.01); *H01L 25/18* (2013.01); *H01L 27/1157* (2013.01); *H01L 27/11519* (2013.01); *H01L 27/11524* (2013.01); *H01L 27/11529* (2013.01); *H01L 27/11556* (2013.01); *H01L 27/11565* (2013.01); *H01L 27/11573* (2013.01); *H01L 27/11582* (2013.01); *H01L 2924/1431* (2013.01); *H01L 2924/1438* (2013.01)

(58) Field of Classification Search
None
See application file for complete search history.

(56) References Cited

U.S. PATENT DOCUMENTS

| | | |
|---|---|---|
| 7,166,495 B2 | 1/2007 | Ball |
| 9,269,654 B2 | 2/2016 | Willkofer et al. |
| 10,177,119 B2 | 1/2019 | Zhang et al. |

(Continued)

*Primary Examiner* — Hsien Ming Lee
(74) *Attorney, Agent, or Firm* — Muir Patent Law, PLLC

(57) ABSTRACT

A semiconductor package includes a package substrate including a first substrate channel pad and a second substrate channel pad, a chip stack including a plurality of semiconductor chips stacked on the package substrate to be offset in a first direction, wherein first semiconductor chips located on odd layers from among the plurality of semiconductor chips and second semiconductor chips located on even layers from among the plurality of semiconductor chips are offset in a second direction perpendicular to the first direction, each of the first semiconductor chips includes a first chip channel pad, and each of the second semiconductor chips includes a second chip channel pad, first inter-chip connection wires configured to electrically connect the first chip channel pads of the first semiconductor chips to one another, second inter-chip connection wires configured to electrically connect the second chip channel pads of the second semiconductor chips to one another.

20 Claims, 11 Drawing Sheets

(56) References Cited

U.S. PATENT DOCUMENTS

| | | |
|---|---|---|
| 2012/0007227 A1 | 1/2012 | Cho et al. |
| 2012/0181689 A1 | 7/2012 | Do et al. |
| 2014/0252656 A1* | 9/2014 | Lee .................... H01L 25/0657 |
| | | 257/777 |
| 2018/0366441 A1 | 12/2018 | Lai et al. |
| 2019/0139936 A1 | 5/2019 | Lai et al. |
| 2020/0098728 A1 | 3/2020 | Xing et al. |

* cited by examiner

US 11,626,380 B2

SEMICONDUCTOR PACKAGE

CROSS-REFERENCE TO RELATED APPLICATION

This application is based on and claims priority under 35 U.S.C. § 119 to Korean Patent Application No. 10-2020-0078046, filed on Jun. 25, 2020, in the Korean Intellectual Property Office, the disclosure of which is incorporated by reference herein in its entirety.

BACKGROUND

The inventive concept relates to semiconductor packages, and more particularly, to a semiconductor package having a structure in which a plurality of semiconductor chips are vertically stacked on one another.

A semiconductor product requires high-capacity data processing while its volume is gradually decreased. A semiconductor package having a structure in which a plurality of semiconductor chips are stacked can fast process high-capacity data while having a small occupied area. However, as the number of stacked semiconductor chips increases and the number of electrode pads formed on the semiconductor chips increases, electrical connection between semiconductor chips becomes difficult and complex.

SUMMARY

The inventive concept provides a semiconductor package capable of improving the reliability of electrical connection between a plurality of semiconductor chips and the reliability of electrical connection between the plurality of semiconductor chips and a substrate.

According to an aspect of the inventive concept, there is provided a semiconductor package including a package substrate including a first substrate channel pad and a second substrate channel pad; a chip stack including a plurality of semiconductor chips stacked on the package substrate to be offset in a first direction, wherein first semiconductor chips located on odd layers from among the plurality of semiconductor chips and second semiconductor chips located on even layers from among the plurality of semiconductor chips are offset in a second direction perpendicular to the first direction, each of the first semiconductor chips comprising a first chip channel pad, and each of the second semiconductor chips comprising a second chip channel pad; first inter-chip connection wires configured to electrically connect the first chip channel pads of the first semiconductor chips to one another; second inter-chip connection wires configured to electrically connect the second chip channel pads of the second semiconductor chips to one another; a first substrate-chip connection wire configured to connect the first chip channel pad of a first semiconductor chip located on a lowest layer from among the first semiconductor chips to the first substrate channel pad; and a second substrate-chip connection wire configured to connect the second chip channel pad of a second semiconductor chip located on a lowest layer from among the second semiconductor chips to the second substrate channel pad.

According to another aspect of the inventive concept, there is provided a semiconductor package including a package substrate including a common substrate pad, a first substrate channel pad, and a second substrate channel pad; a plurality of semiconductor chips stacked on the package substrate to be offset in a first direction, each of the plurality of semiconductor chips including a common pad and a channel pad; first inter-chip connection wires configured to electrically connect the channel pads of semiconductor chips located on odd layers from among the plurality of semiconductor chips to one another; second inter-chip connection wires configured to electrically connect the channel pads of semiconductor chips located on even layers from among the plurality of semiconductor chips to one another; third inter-chip connection wires configured to electrically connect the common pads of the plurality of semiconductor chips to one another; a first substrate-chip connection wire configured to electrically connect the channel pad of a semiconductor chip located on a lowest layer from among the semiconductor chips located on the odd layers to the first substrate channel pad; a second substrate-chip connection wire configured to electrically connect the channel pad of a semiconductor chip located on a lowest layer from among the semiconductor chips located on the even layers to the second substrate channel pad; a third substrate-chip connection wire configured to electrically connect the common pad of the semiconductor chip located on the lowest layer from among the semiconductor chips located on the odd layers to the common substrate pad; and a controller mounted on the package substrate and including a first channel and a second channel separated from each other. The first channel of the controller is electrically connected to the semiconductor chips located on the odd layers through the first substrate-chip connection wire and the first inter-chip connection wires, and the second channel of the controller is electrically connected to the semiconductor chips located on the even layers through the second substrate-chip connection wire and the second inter-chip connection wires.

According to another aspect of the inventive concept, there is provided a semiconductor package including a package substrate including a common substrate pad, a first substrate channel pad, and a second substrate channel pad; a plurality of semiconductor chips stacked on the package substrate in a vertical direction, each of the plurality of semiconductor chips including a common pad and a channel pad; first inter-chip connection wires configured to electrically connect the channel pads of semiconductor chips located on odd layers from among the first semiconductor chips to one another; second inter-chip connection wires configured to electrically connect the channel pads of semiconductor chips located on even layers from among the plurality of semiconductor chips to one another; third inter-chip connection wires configured to electrically connect the common pads of the plurality of semiconductor chips to one another; a first substrate-chip connection wire configured to connect the channel pad of a semiconductor chip located on a lowest layer from among the semiconductor chips located on the odd layers to the first substrate channel pad; a second substrate-chip connection wire configured to connect the channel pad of a semiconductor chip located on a lowest layer from among the semiconductor chips located on the even layers to the second substrate channel pad; a third substrate-chip connection wire configured to electrically connect the common pad of the semiconductor chip located on the lowest layer from among the semiconductor chips located on the odd layers to the common substrate pad; and a controller mounted on the package substrate, electrically connected to the semiconductor chips located on the odd layers through the first substrate-chip connection wire and the first inter-chip connection wires, and electrically connected to the semiconductor chips located on the even layers through the second substrate-chip connection wire and the second inter-chip connection wires. A number of first inter-chip connection wires is equal to a number obtained by subtracting 1 from a total number of the semiconductor chips located on the odd layers, a number of second inter-chip connection wires is equal to a number obtained by subtracting 1 from a total number of the semiconductor chips located on the even layers, and a number of third inter-chip connection wires is equal to a number obtained by subtracting 1 from a total number of the plurality of semiconductor chips.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
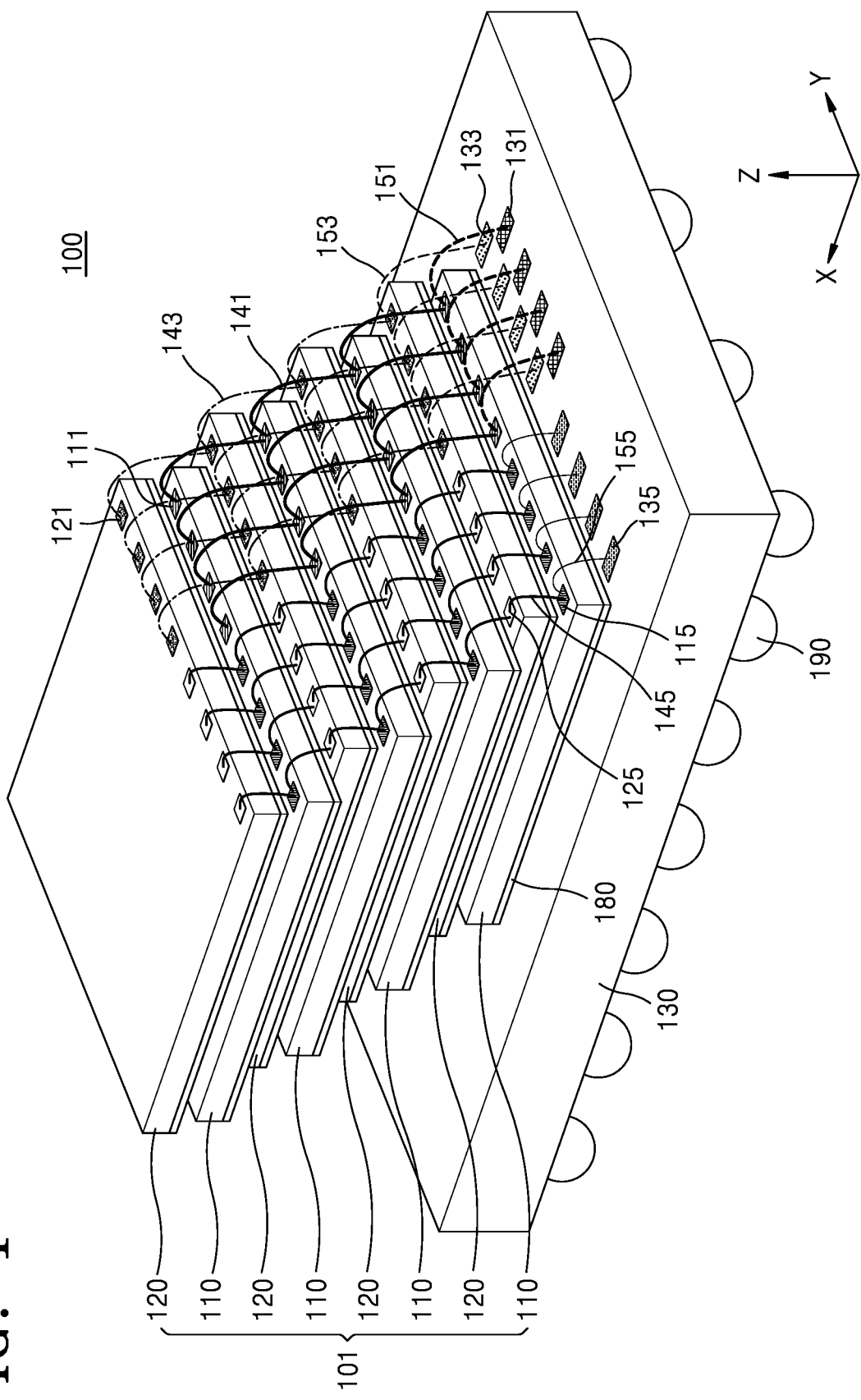
FIG. 1 is a perspective view of a semiconductor package, according to an example embodiment of the inventive concept.

Hereinafter, embodiments of the inventive concept will be described more fully with reference to the accompanying drawings. In the accompanying drawings, like reference numerals may refer to like elements, and repeated descriptions of the like elements will be omitted.

Figure 2:
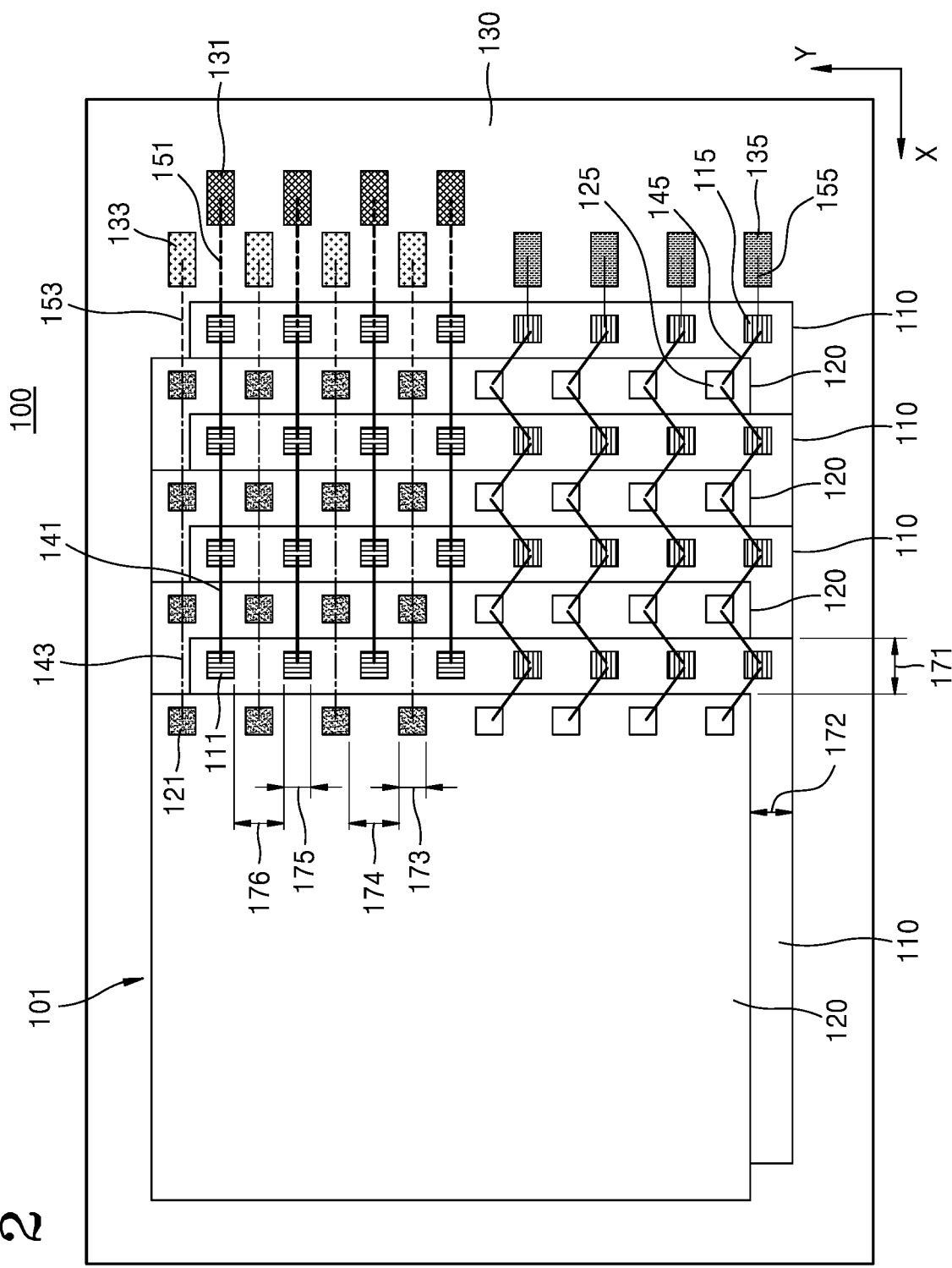
FIG. 2 is a plan view of the semiconductor package of FIG. 1.
Figure 3:
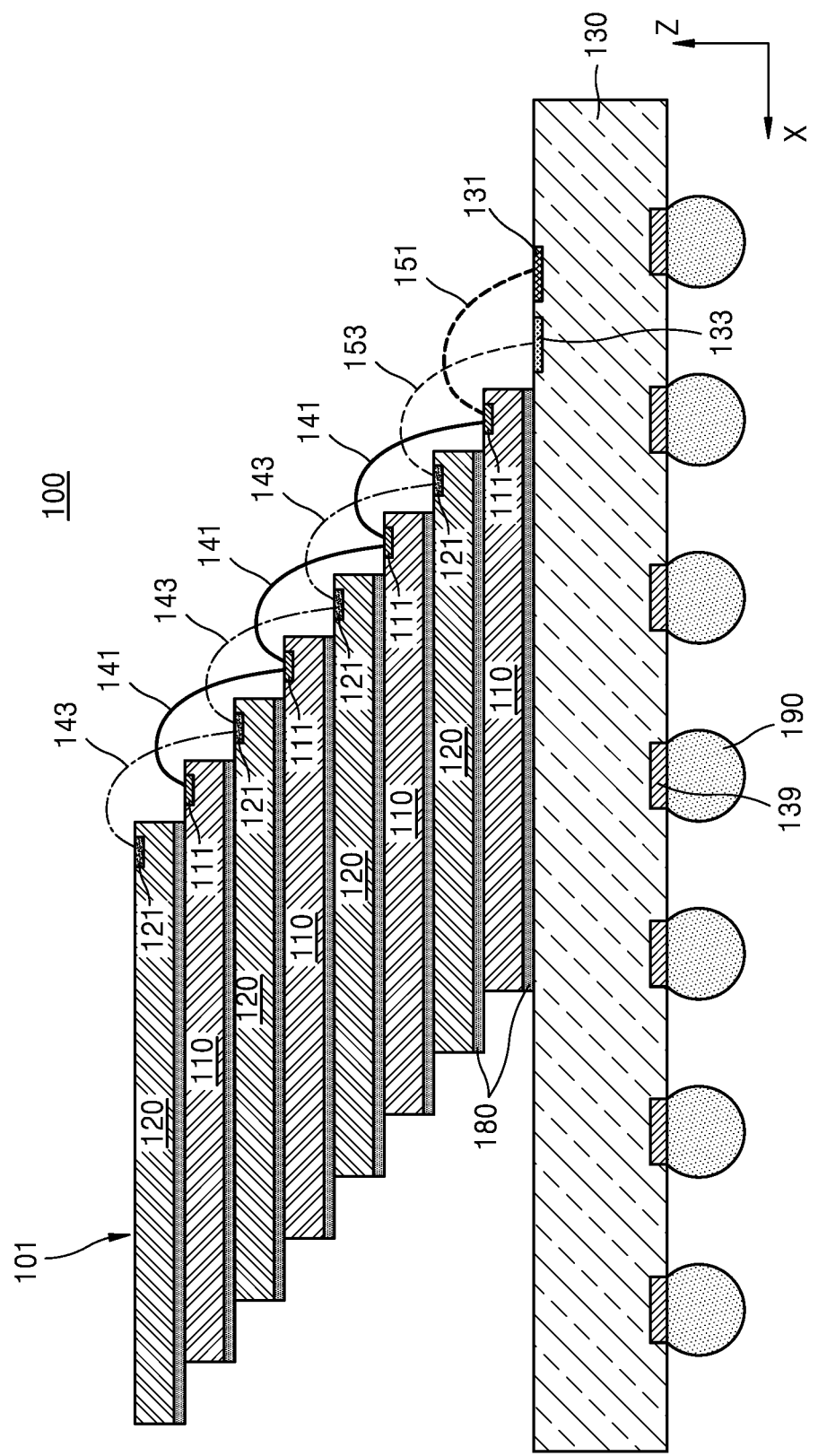
FIGS. 3 and 4 are cross-sectional views illustrating different cross-sections of the semiconductor package of FIG. 1.
Figure 4:
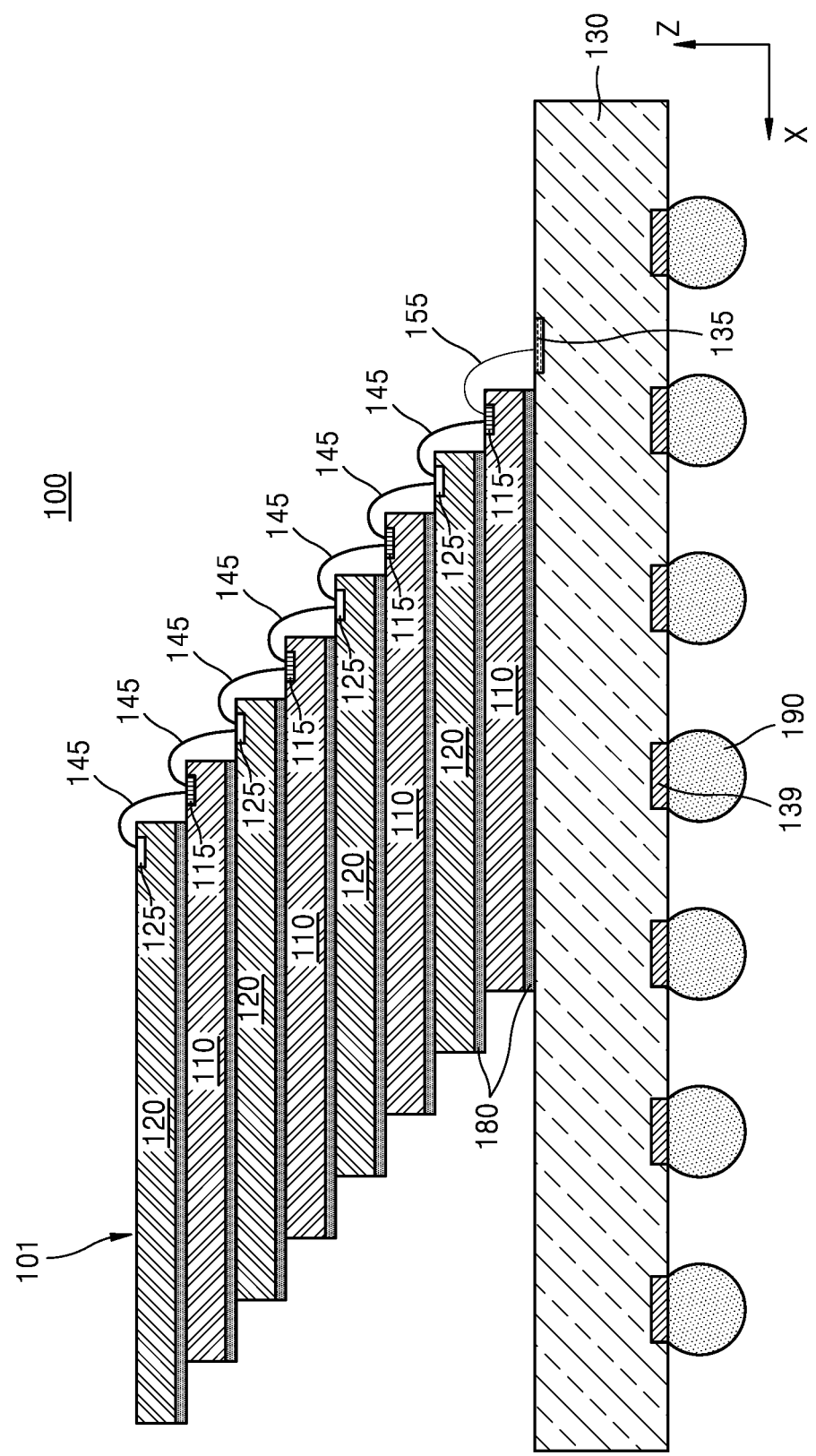

FIG. 1 is a perspective view of a semiconductor package 100, according to an example embodiment of the inventive concept. FIG. 2 is a plan view of the semiconductor package 100 of FIG. 1. FIGS. 3 and 4 are cross-sectional views illustrating different cross-sections of the semiconductor package 100.

Referring to FIGS. 1 through 4, the semiconductor package 100 may include a package substrate 130 and a chip stack 101.

The package substrate 130 may include, for example, a printed circuit board (PCB), a flexible substrate, or a tape substrate. The package substrate 130 may include upper substrate pads arranged on an upper surface of the package substrate 130. For example, one or more substrate common pads 135, one or more first substrate channel pads 131, and one or more second substrate channel pads 133 may be provided on the upper surface of the package substrate 130. The package substrate 130 may include lower substrate pads 139 arranged on a lower surface of the package substrate 130. External connection terminals 190 configured to electrically connect an external apparatus to the semiconductor package 100 may be arranged on the lower substrate pads 139. The external connection terminals 190 may be, for example, solder balls.

The chip stack 101 may include a plurality of semiconductor chips stacked on the package substrate 130 in a vertical direction (Z direction). Although the chip stack 101 includes eight semiconductor chips stacked in the vertical direction in FIGS. 1 through 4, embodiments are not limited thereto. For example, the chip stack 101 may include three to seven semiconductor chips or nine or more semiconductor chips.

According to exemplary embodiments of the inventive concept, the chip stack 101 may include first semiconductor chips 110 located on odd layers from among the plurality of semiconductor chips, and second semiconductor chips 120 located on even layers from among the plurality of semiconductor chips. The odd layers and the odd layers are defined based on the upper surface of the package substrate 130 on which the chip stack 101 is mounted. A first semiconductor chip 110 located on the lowest layer from among the first semiconductor chips 110 refers to a semiconductor chip nearest to the upper surface of the package substrate 130 in a direction perpendicular to the upper surface of the package substrate 130 from among the first semiconductor chips 110, and a second semiconductor chip 120 located on the lowest layer from among the second semiconductor chips 120 refers to a semiconductor chip nearest to the upper surface of the package substrate 130 in a direction perpendicular to the upper surface of the package substrate 130 (e.g., the Z direction) from among the second semiconductor chips 120.

As illustrated in FIGS. 1 through 4, the first semiconductor chips 110 and the second semiconductor chips 120 may alternate with each other in the vertical direction on the upper surface of the package substrate 130. For example, when the chip stack 101 includes eight semiconductor chips, the chip stack 101 may include four first semiconductor chips 110 and four second semiconductor chips 120.

According to exemplary embodiments, the plurality of semiconductor chips included in the chip stack 101 may be the same kind of semiconductor chips. For example, the plurality of semiconductor chips may be memory semiconductor chips. Each of the memory semiconductor chips may be, for example, a volatile memory semiconductor chip, such as Dynamic Random Access Memory (DRAM) or Static Random Access Memory (SRAM), or a non-volatile memory semiconductor chip, such as Phase-change Random Access Memory (PRAM), Magnetoresistive Random Access Memory (MRAM), Ferroelectric Random Access Memory (FeRAM), or Resistive Random Access Memory (RRAM). According to some exemplary embodiments, the plurality of semiconductor chips may be flash memories, for example, NAND flash memories.

According to other exemplary embodiments, the plurality of semiconductor chips included in the chip stack 101 may include different kinds of semiconductor chips. For example, some of the plurality of semiconductor chips may be logic chips, and the other ones may be memory chips. For example, each of the logic chips may be a central processing unit (CPU) chip, a graphics processing unit (GPU) chip, or an application processor (AP) chip.

Each semiconductor chip may include chip pads that are adjacent to a first edge of the semiconductor chip and are arranged along the first edge thereof. For example, the chip pads of each semiconductor chip may be arranged in a second direction (Y direction), adjacent to the edge that is parallel to the second direction (Y direction). The chip pads included in each semiconductor chip may be electrically connected to an integrated circuit provided within the semiconductor chip. For example, the integrated circuit may include a memory circuit or a logic circuit.

According to exemplary embodiments, the plurality of semiconductor chips may have the same dimensions. For example, the plurality of semiconductor chips may have the same horizontal widths, the same vertical widths, and the same thicknesses.

The plurality of semiconductor chips may have pad arrangements having the same shapes. For example, the number of chip pads included in each semiconductor chip, an arrangement sequence of the chip pads, the size of each chip pad, and an interval between the chip pads may be the same in the plurality of semiconductor chips.

An adhesion member 180 may be provided on the lower surface of each first semiconductor chip 110 and the lower surface of each second semiconductor chip 120. A first semiconductor chip 110 may be stacked on a second semiconductor chip 120 arranged therebelow through an adhesion member 180, and the second semiconductor chip 120 may be stacked on a first semiconductor chip 110 arranged therebelow through another adhesion member 180. A first semiconductor chip 110 arranged on the lowest layer from among the first semiconductor chips 110 may be attached to the upper surface of the package substrate 130 through another adhesion member 180. For example, the adhesion members 180 may be die attach films (DAFs).

The plurality of semiconductor chips included in the chip stack 101 may be stacked to be sequentially offset from each other in a first direction (X direction), such that each semiconductor chip extends beyond a side surface of an underlying semiconductor chip. For example, a second semiconductor chip 120 may be stacked on a first semiconductor chip 110 arranged therebelow such that a portion of the second semiconductor chip 120 protrudes from the first semiconductor chip 110 in the first direction (X direction). A first semiconductor chip 110 may be stacked on a second semiconductor chip 120 arranged therebelow such that a portion of the first semiconductor chip 110 protrudes from the second semiconductor chip 120 in the first direction (X direction). For example, the plurality of semiconductor chips may be stacked on one another in a stepwise manner.

The plurality of semiconductor chips may be stacked to be offset by a first offset distance 171 in the first direction (X direction) such that the chip pads included in each semiconductor chip are exposed. For example, a second semiconductor chip 120 may be stacked to be offset by the first offset distance 171 in the first direction (X direction) such that the chip pads of a first semiconductor chip 110 arranged below the second semiconductor chip 120 are not covered. A first semiconductor chip 110 may be stacked to be offset by the first offset distance 171 in the first direction (X direction) such that the chip pads of a second semiconductor chip 120 arranged below the first semiconductor chip 110 are not covered.

According to exemplary embodiments, the first offset distance 171 may be between about 230 micrometers (μm) and about 400 μm. When the first offset distance 171 is less than 230 μm, the chip pads of each semiconductor chip may be covered by other semiconductor chips. When the first offset distance 171 is greater than 400 μm, a stacking structure of the plurality of semiconductor chips may collapse.

According to exemplary embodiments, the second semiconductor chips 120 may be offset from the first semiconductor chips 110 in the second direction (Y direction) perpendicular to the first direction (X direction). For example, a second semiconductor chip 120 may be stacked on a first semiconductor chip 110 arranged therebelow such that a portion of the second semiconductor chip 120 protrudes from the first semiconductor chip 110 in the second direction (Y direction). A first semiconductor chip 110 may be stacked on a second semiconductor chip 120 arranged therebelow such that a portion of the first semiconductor chip 110 protrudes from the second semiconductor chip 120 in the second direction (Y direction). Because the plurality of semiconductor chips included in the chip stack 101 are sequentially offset in the first direction (X direction) and also the second semiconductor chips 120 are offset from the first semiconductor chips 110 in the second direction (Y direction), the plurality of semiconductor chips may be arranged in a zigzag manner in a planar view shown in FIG. 2. For example, side surfaces of the first semiconductor chips 110 may be aligned along the first direction (X direction) and side surfaces of the second semiconductor chips 120 may be aligned along the first direction (X direction).

According to exemplary embodiments, when a distance by which the second semiconductor chips 120 are offset from the first semiconductor chips 110 in the second direction (Y direction) is defined as a second offset distance 172, the second offset distance 172 may be about 60 μm to about 80 μm. For example, the side surfaces of the first semiconductor chips 110 may be offset from the adjacent side surfaces of the second semiconductor chips 120 in the second direction (Y direction) by the second offset distance 172.

Each of the first semiconductor chips 110 may include chip pads arranged along the first edge of each of the first semiconductor chips 110. The chip pads of each of the first semiconductor chips 110 may include one or more first chip channel pads 111 and one or more first chip common pads 115.

Each of the first semiconductor chips 110 may have the same pad arrangements. For example, an arrangement sequence of the chip pads including the first chip channel pads 111 and the first chip common pads 115, the number of first chip channel pads 111, the number of first chip common pads 115, and an interval between the chip pads may be the same in each of the first semiconductor chips 110. The first chip channel pads 111 of the first semiconductor chips 110 located on different layers may be arranged side by side in the first direction (X direction), when viewed in plan view. For example, the first chip channel pads 111 of the first semiconductor chips 110 located on different layers may be aligned in the first direction (X direction). The first chip common pads 115 of the first semiconductor chips 110 located on different layers may be arranged side by side in the first direction (X direction), when viewed in plan view. For example, the first chip common pads 115 of the first semiconductor chips 110 located on different layers may be aligned in the first direction (X direction). According to exemplary embodiments, a width 175 of each of the first chip channel pads 111 in the second direction (Y direction) may be about 50 μm to about 80 μm. According to exemplary embodiments, an interval 176 between two adjacent first chip channel pads 111 in the second direction (Y direction) may be about 80 μm to about 180 μm.

The first chip channel pads 111 of the first semiconductor chips 110 located on different layers may be electrically connected to each other by first inter-chip connection wires 141. Each of the first inter-chip connection wires 141 may connect the first chip channel pads 111 of two first semiconductor chips 110 spaced apart from each other in the vertical direction with a single second semiconductor chip 120 between the two first semiconductor chips 110. For example, the first chip channel pads 111 of first semiconductor chips 110 located on first and third layers may be electrically connected to each other, the first chip channel pads 111 of first semiconductor chips 110 located on the third layer and a fifth layer may be electrically connected to each other, and the first chip channel pads 111 of first semiconductor chips 110 located on the fifth layer and a seventh layer may be electrically connected to each other, by different first inter-chip connection wires 141. In this case, the number of first inter-chip connection wires 141 may be equal to a number obtained by subtracting 1 from the total number of first semiconductor chips 110 included in the chip stack 101. For example, three first inter-chip connection wires 141 may be used to electrically connect the first chip channel pads 111 that are aligned in the first direction (X direction) of the four first semiconductor chips 110. For example, each set of the first chip channel pads 111 aligned in the first direction (X direction) may be electrically connected to one another with a number of first inter-chip connection wires 141 that is one less than the total number of first chip channel pads 111 aligned in the first direction (X direction).

According to exemplary embodiments, the first semiconductor chips 110 may be NAND flash memories, and may be connected to the same channel. The channel may refer to a collection of signals for use in the NAND flash memories. For example, because the first chip channel pads 111 of the first semiconductor chips 110 located on different layers are electrically connected to each other by the first inter-chip connection wires 141, the first semiconductor chips 110 may be connected to the same channel.

The first chip channel pads 111 of the first semiconductor chip 110 located on the lowest layer from among the first semiconductor chips 110 may be electrically connected to the first substrate channel pads 131 of the package substrate 130 by first substrate-chip connection wires 151. The first substrate-chip connection wires 151 may be configured to transmit various signals to the first chip channel pads 111 of the first semiconductor chips 110 connected to the same channel.

According to exemplary embodiments, each of the first chip channel pads 111 may correspond to one of an input/output (I/O) pad through which a data I/O signal is transmitted, a data strobe signal (DQS) pad through which a DQS is transmitted, a chip enable (CE) pad through which a CE signal is transmitted, a read enable (RE) pad through which an RE signal is transmitted, a write enable (WE) pad through which a WE signal is transmitted, a command latch enable (CLE) pad through which a CLE signal is transmitted, an address latch enable (ALE) pad through which an ALE signal is transmitted, and a ready/busy (R/B) pad through which an R/B signal is transmitted.

According to exemplary embodiments, each of the first chip common pads 115 may correspond to a Vcc pad for supplying a power supply voltage (for example, a voltage of 2.0 V to 5.0 V) to the first semiconductor chip 110, or a Vss pad for supplying a ground voltage to the first semiconductor chip 110.

Each of the second semiconductor chips 120 may include chip pads arranged along a first edge of each of the second semiconductor chips 120. The chip pads of each of the second semiconductor chips 120 may include one or more second chip channel pads 121 and one or more second chip common pads 125.

Each of the second semiconductor chips 120 may have the same pad arrangements. For example, an arrangement sequence of the chip pads including the second chip channel pads 121 and the second chip common pads 125, the number of second chip channel pads 121, the number of second chip common pads 125, and an interval between the chip pads may be the same in each of the second semiconductor chips 120. The second chip channel pads 121 of the second semiconductor chips 120 located on different layers may be arranged side by side in the first direction (X direction), when viewed in plan view. For example, the second chip channel pads 121 of the second semiconductor chips 120 located on different layers may be aligned along the first direction (X direction). The second chip common pads 125 of the second semiconductor chips 120 located on different layers may be arranged side by side in the first direction (X direction), when viewed in plan view. For example, the second chip common pads 125 of the second semiconductor chips 120 located on different layers may be aligned along the first direction (X direction). According to exemplary embodiments, a width 173 of each of the second chip channel pads 121 in the second direction (Y direction) may be about 50 μm to about 80 μm. According to exemplary embodiments, an interval 174 between two adjacent second chip channel pads 121 in the second direction (Y direction) may be about 80 μm to about 180 μm. According to exemplary embodiments, a pad arrangement of the chip pads of the second semiconductor chips 120 may be the same as a pad arrangement of the chip pads of the first semiconductor chips 110.

The second chip channel pads 121 of the second semiconductor chips 120 located on different layers may be electrically connected to each other by second inter-chip connection wires 143. Each of the second inter-chip connection wires 143 may connect the second chip channel pads 121 of two second semiconductor chips 120 spaced apart from each other in the vertical direction with a single first semiconductor chip 110 between the two second semiconductor chips 120. For example, the second chip channel pads 121 of second semiconductor chips 120 located on second and fourth layers may be electrically connected to each other, the second chip channel pads 121 of second semiconductor chips 120 located on the fourth layer and a sixth layer may be electrically connected to each other, and the second chip channel pads 121 of second semiconductor chips 120 located on the sixth layer and an eighth layer may be electrically connected to each other, by different second inter-chip connection wires 143. In this case, the number of second inter-chip connection wires 143 may be equal to a number obtained by subtracting 1 from the total number of second semiconductor chips 120 included in the chip stack 101. For example, three second inter-chip connection wires 143 may be used to electrically connect the second chip channel pads 121 that are aligned in the first direction (X direction) of four second semiconductor chips 120. For example, each set of the second chip channel pads 121 aligned in the first direction (X direction) may be electrically connected to one another with a number of second inter-chip connection wires 143 that is one less than the total number of second chip channel pads 121 aligned in the first direction (X direction).

According to exemplary embodiments, the second semiconductor chips 120 may be NAND flash memories, and may be connected to the same channel. For example, because the second chip channel pads 121 of the second semiconductor chips 120 located on different layers are electrically connected to each other by the second inter-chip connection wires 143, the second semiconductor chips 120 may be connected to the same channel. In this case, the second semiconductor chips 120 may be connected to a different channel from the channel to which the first semiconductor chips 110 are connected.

The second chip channel pads 121 of the second semiconductor chip 120 located on the lowest layer from among the second semiconductor chips 120 may be electrically connected to the second substrate channel pads 133 of the package substrate 130 by second substrate-chip connection wires 153. The second substrate-chip connection wires 153 may be configured to transmit various signals to the second chip channel pads 121 of the second semiconductor chips 120 connected to the same channel.

According to exemplary embodiments, each of the second chip channel pads 121 may correspond to one of an I/O pad, a DQS pad, a CE pad, an RE pad, a WE pad, a CLE pad, an ALE pad, and an R/B pad.

According to exemplary embodiments, each of the second chip common pads 125 may correspond to a Vcc pad for supplying a power supply voltage to the second semiconductor chip 120, or a Vss pad for supplying a ground voltage to the second semiconductor chip 120.

The first chip common pads 115 of the first semiconductor chips 110 located on different layers may be electrically connected to the second chip common pads 125 of the second semiconductor chips 120 located on different layers by third inter-chip connection wires 145. Each of the third inter-chip connection wires 145 may extend between a first semiconductor chip 110 and a second semiconductor chip 120 to contact each other in the vertical direction. For example, each first semiconductor chip 110 may be connected to one or more second semiconductor chips 120 located at adjacent levels via the third inter-chip connection wires 145. In this case, the number of third inter-chip connection wires 145 may be equal to a number obtained by subtracting 1 from a sum of the number of first semiconductor chips 110 and the number of second semiconductor chips 120. For example, when the chip stack 101 includes eight semiconductor chips, seven third inter-chip connection wires 145 may be used to electrically connect the first chip common pads 115 of the first semiconductor chips 110 to the second chip common pads 125 of the second semiconductor chips 120.

The first chip common pads 115 of the first semiconductor chip 110 located on the lowest layer from among the first semiconductor chips 110 may be electrically connected to the substrate common pads 135 of the package substrate 130 by third substrate-chip connection wires 155.

A signal that is commonly supplied to the first semiconductor chips 110 and the second semiconductor chips 120 may be transmitted through the third inter-chip connection wires 145 and the third substrate-chip connection wires 155. For example, through the third inter-chip connection wires 145 and the third substrate-chip connection wires 155, a power supply voltage and a ground voltage necessary for driving each of the semiconductor chips may be supplied to each of the semiconductor chips.

The first inter-chip connection wires 141, the second inter-chip connection wires 143, the third inter-chip connection wires 145, the first substrate-chip connection wires 151, the second substrate-chip connection wires 153, and the third substrate-chip connection wires 155 may be formed via a wire bonding process, and may be conductive wires including a conductive material such as gold (Au) or copper (Cu).

The first chip channel pads 111 of the first semiconductor chips 110 connected by the first inter-chip connection wires 141 may be spaced apart from the second chip channel pads 121 of the second semiconductor chips 120 connected by the second inter-chip connection wires 143, in the second direction (Y direction). In this case, the first inter-chip connection wires 141 connecting the first chip channel pads 111 of the first semiconductor chips 110 to each other may be spaced apart from the second inter-chip connection wires 143 connecting the second chip channel pads 121 of the second semiconductor chips 120 to each other, in the second direction (Y direction).

According to exemplary embodiments, each of an interval 176 between adjacent first chip channel pads 111 and an interval 174 between adjacent second chip channel pads 121 may be different from the second offset distance 172, which is a distance by which the second semiconductor chips 120 are offset from the first semiconductor chips 110 in the second direction (Y direction). When the interval 176 between adjacent first chip channel pads 111 and the interval 174 between adjacent second chip channel pads 121 are different from the second offset distance 172, the first chip channel pads 111 of the first semiconductor chips 110 and the second chip channel pads 121 of the second semiconductor chips 120 may be offset in the second direction (Y direction), and accordingly, the first inter-chip connection wires 141 and the second inter-chip connection wires 143 may be spaced apart from each other in the second direction (Y direction).

For example, each of the interval 176 between adjacent first chip channel pads 111 and the interval 174 between adjacent second chip channel pads 121 is greater than the second offset distance 172. According to exemplary embodiments, the second offset distance 172 may be about 70% to about 90% of the interval 176 between adjacent first chip channel pads 111 or about 70% to about 90% of the interval 174 between adjacent second chip channel pads 121.

Although not shown in FIGS. 1 through 4, the semiconductor package 100 may include a molding layer that covers the chip stack 101 provided on the package substrate 130. For example, the molding layer may be formed to cover the upper surface of the package substrate 130 and cover respective lateral surfaces of the semiconductor chips included in the chip stack 101. For example, the molding layer may include insulative resin or an epoxy mold compound (EMC).

In general, a semiconductor package including a plurality of semiconductor chips stacked in the vertical direction uses a long wire extending beyond two or more semiconductor chips, in order to accomplish electrical connection between the semiconductor chips or electrical connection between a semiconductor chip and a package substrate. The long wire has a great loop height compared with other relatively-short wires, and is easily shifted or sagged during a manufacturing process such as a molding process. Due to the shifting or sagging of the long wire, the long wire contacts the other wires and thus an electrical short circuit frequently occurs.

However, according to embodiments of the inventive concept, the semiconductor package 100 may implement electrical connection between the semiconductor chips or electrical connection between a semiconductor chip and the package substrate 130, by using conductive wires having relatively small lengths. Accordingly, an electrical short circuit due to shifting or sagging of a conductive wire may be addressed. Furthermore, because the first semiconductor chips 110 and the second semiconductor chips 120 connected to different channels may be stacked alternately, electrical connection between a first semiconductor chip 110 and the package substrate 130 or electrical connection between a second semiconductor chip 120 and the package substrate 130 may be implemented without using a long wire. Accordingly, an electrical short circuit between conductive wires that constitute different channels may be prevented. Accordingly, in the semiconductor package 100, electrical connection between a plurality of semiconductor chips and electrical connection between the plurality of semiconductor chips and a substrate may have improved reliability.

Figure 5:
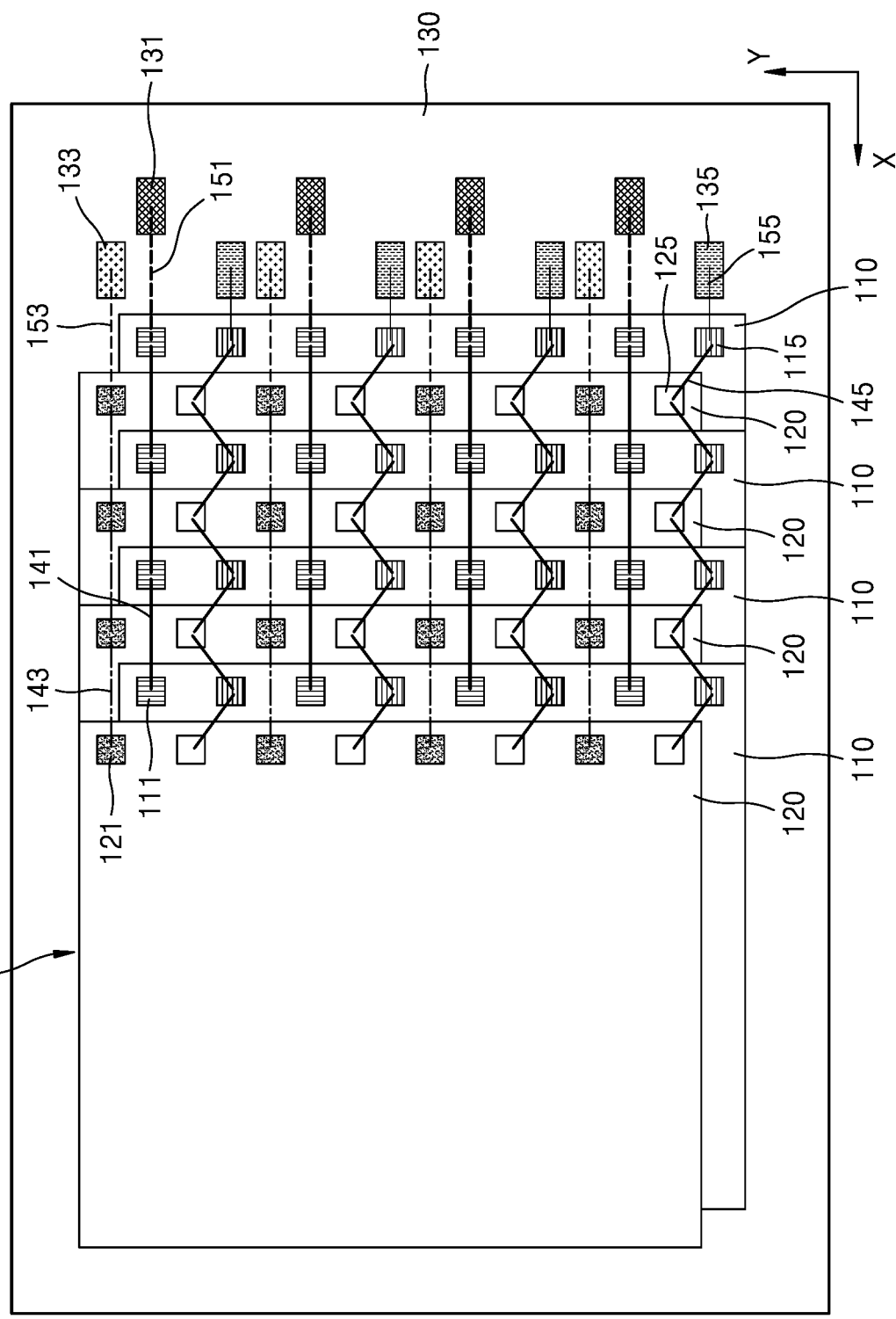
FIG. 5 is a plan view of a semiconductor package, according to an example embodiment of the inventive concept.

FIG. 5 is a plan view of a semiconductor package 100a, according to an example embodiment of the inventive concept. The semiconductor package 100a of FIG. 5 may be substantially the same as the semiconductor package 100 described above with reference to FIGS. 1 through 4, except for a pad arrangement of each semiconductor chip. For convenience of explanation, descriptions that are the same as those given above will be omitted or briefly given.

Referring to FIG. 5, each first semiconductor chip 110 may include two or more first chip common pads 115 and two or more first chip channel pads 111. In each first semiconductor chip 110, one first chip channel pad 111 may be disposed between two first chip common pads 115 adjacent in the second direction (Y direction), and two adjacent first chip channel pads 111 may be spaced apart from each other in the second direction (Y direction) with one first chip common pad 115 therebetween. In this case, the first chip channel pads 111 configured such that data or the like is input or output are spaced apart from each other with the first chip common pads 115 therebetween, the first chip common pads 115 being provided with a power supply voltage or a ground voltage, and thus, signal interference may be prevented from occurring between the first chip channel pads 111 due to noise.

Each second semiconductor chip 120 may include two or more second chip common pads 125 and two or more second chip channel pads 121. In each second semiconductor chip 120, one second chip channel pad 121 may be disposed between two second chip common pads 125 adjacent in the second direction (Y direction), and two adjacent second chip channel pads 121 may be spaced apart from each other in the second direction (Y direction) with one second chip common pad 125 therebetween. In this case, the second chip channel pads 121 configured such that data or the like is input or output are spaced apart from each other with the second chip common pads 125 therebetween, the second chip common pads 125 being provided with a power supply voltage or a ground voltage, and thus, signal interference may be prevented from occurring between the second chip channel pads 121 due to noise.

Figure 6:
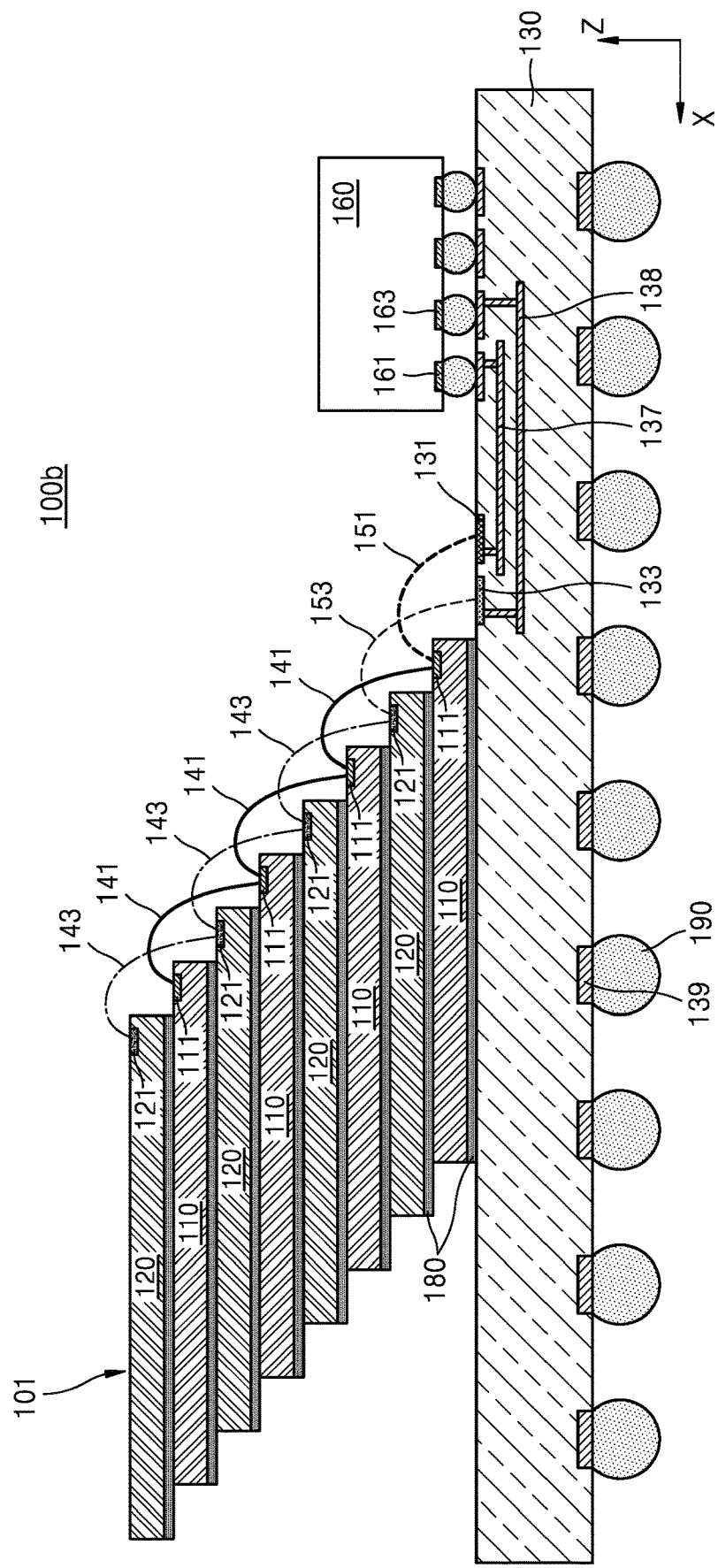
FIG. 6 is a cross-sectional view of a semiconductor package, according to an example embodiment of the inventive concept.
Figure 7:
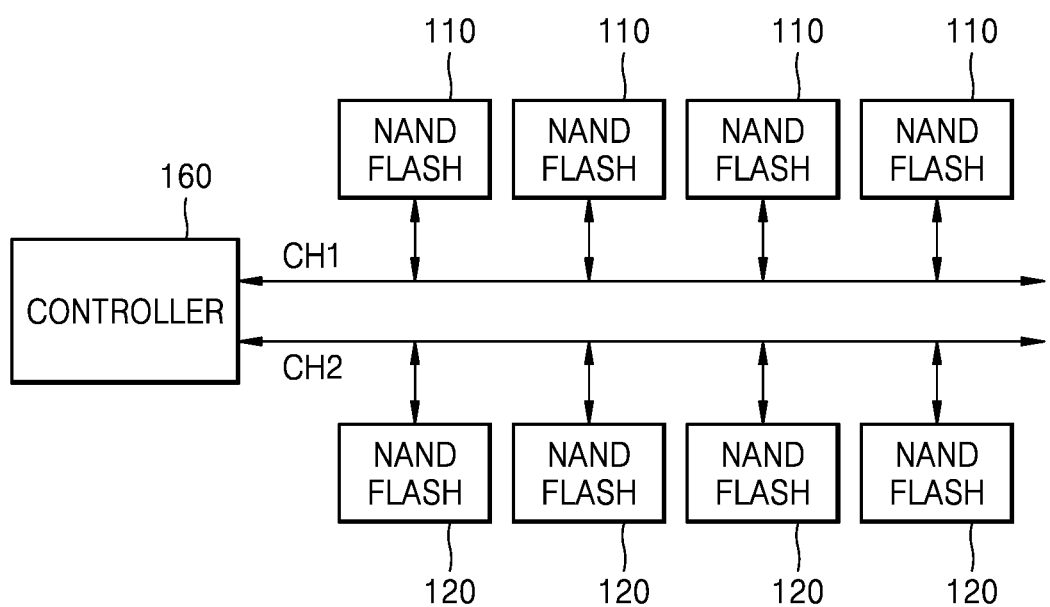
FIG. 7 is a block diagram illustrating main components of the semiconductor package of FIG. 6.

FIG. 6 is a cross-sectional view of a semiconductor package 100b, according to an example embodiment of the inventive concept. FIG. 7 is a block diagram illustrating main components of the semiconductor package 100b of FIG. 6. For convenience of explanation, descriptions that are the same as those given above will be omitted or briefly given.

Referring to FIGS. 6 and 7, the semiconductor package 100b may include a controller 160 configured to control operations of the semiconductor chips included in the chip stack 101.

The controller 160 may be mounted on the package substrate 130. For example, the controller 160 may be mounted on the package substrate 130 in a flip chip manner. Connection bumps may be between the pads of the controller 160 and the pads of the package substrate 130 in order to electrically connect the pads of the controller 160 to the pads of the package substrate 130. The controller 160 may be electrically connected to the semiconductor chips of the chip stack 101 through an interconnection path provided within the package substrate 130. According to some exemplary embodiments, in contrast with FIG. 6, the controller 160 may be provided outside the semiconductor package 100b.

According to exemplary embodiments, the controller 160 may include two channels separated from each other, and may be connected to the semiconductor chips of the chip stack 101 through the two channels. For example, a first channel CH1 of the controller 160 may be connected to the first semiconductor chips 110 located on odd layers in the chip stack 101, and a second channel CH2 of the controller 160 may be connected to the second semiconductor chips 120 located on even layers in the chip stack 101. The controller 160 may provide a first channel signal and a second channel signal to the first semiconductor chips 110 and the second semiconductor chips 120, respectively, through the two separate channels (e.g., the first and second channels CH1 and CH2). For example, each of the first channel signal and the second channel signal may include an I/O signal, a DQS signal, a CE signal, an RE signal, a WE signal, a CLE signal, an ALE signal, an R/B signal, or the like.

According to exemplary embodiments, the controller 160 may be electrically connected to the first semiconductor chips 110 and the second semiconductor chips 120 through separate electrical paths. For example, a first pad 161 of the controller 160 may be electrically connected to a first substrate channel pad 131 of the package substrate 130 through a first interconnection path 137 of the package substrate 130, and a second pad 163 of the controller 160 may be electrically connected to a second substrate channel pad 133 of the package substrate 130 through a second interconnection path 138 of the package substrate 130. In this case, the first channel signal provided to the first pad 161 of the controller 160 may be provided to the first semiconductor chips 110 via the first interconnection path 137 of the package substrate 130, the first substrate-chip connection wires 151, and the first inter-chip connection wires 141. The second channel signal provided to the second pad 163 of the controller 160 may be provided to the second semiconductor chips 120 via the second interconnection path 138 of the package substrate 130, the second substrate-chip connection wires 153, and the second inter-chip connection wires 143.

In FIGS. 6 and 7, the controller 160 has two channels. However, the controller 160 may have three or more channels. In this case, each of the channels of the controller 160 may be configured to be connected to two or more semiconductor chips connected.

Figure 8:
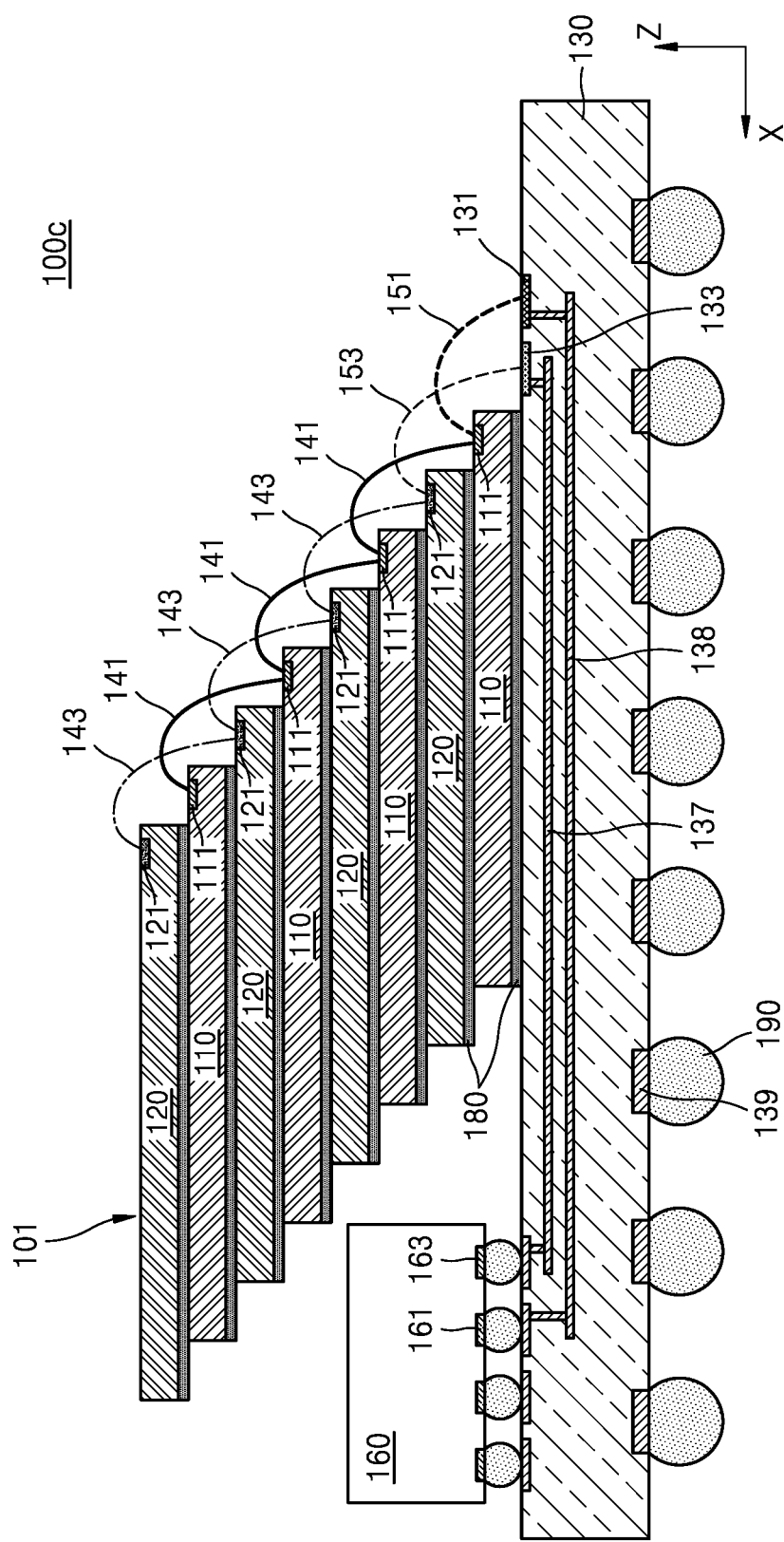
FIG. 8 is a cross-sectional view of a semiconductor package, according to an example embodiment of the inventive concept.

FIG. 8 is a cross-sectional view of a semiconductor package 100c, according to an example embodiment of the inventive concept. The semiconductor package 100c of FIG. 8 may be substantially the same as the semiconductor package 100b described above with reference to FIGS. 6 and 7, except for a pad arrangement of each semiconductor chip. For convenience of explanation, descriptions that are the same as those given above will be omitted or briefly given.

Referring to FIG. 8, the controller 160 may be mounted on the package substrate 130 to be at least partially overlapped by the chip stack 101 in a vertical direction perpendicular to the upper surface of the package substrate 130. For example, as viewed from above, a portion of the controller 160 may be overlapped by and covered with some semiconductor chips. As another example, as viewed from above, the controller 160 may be completely overlapped by and covered with some semiconductor chips. When the controller 160 is overlapped by the chip stack 101, the semiconductor package 100c may have a reduced planar size.

Figure 9:
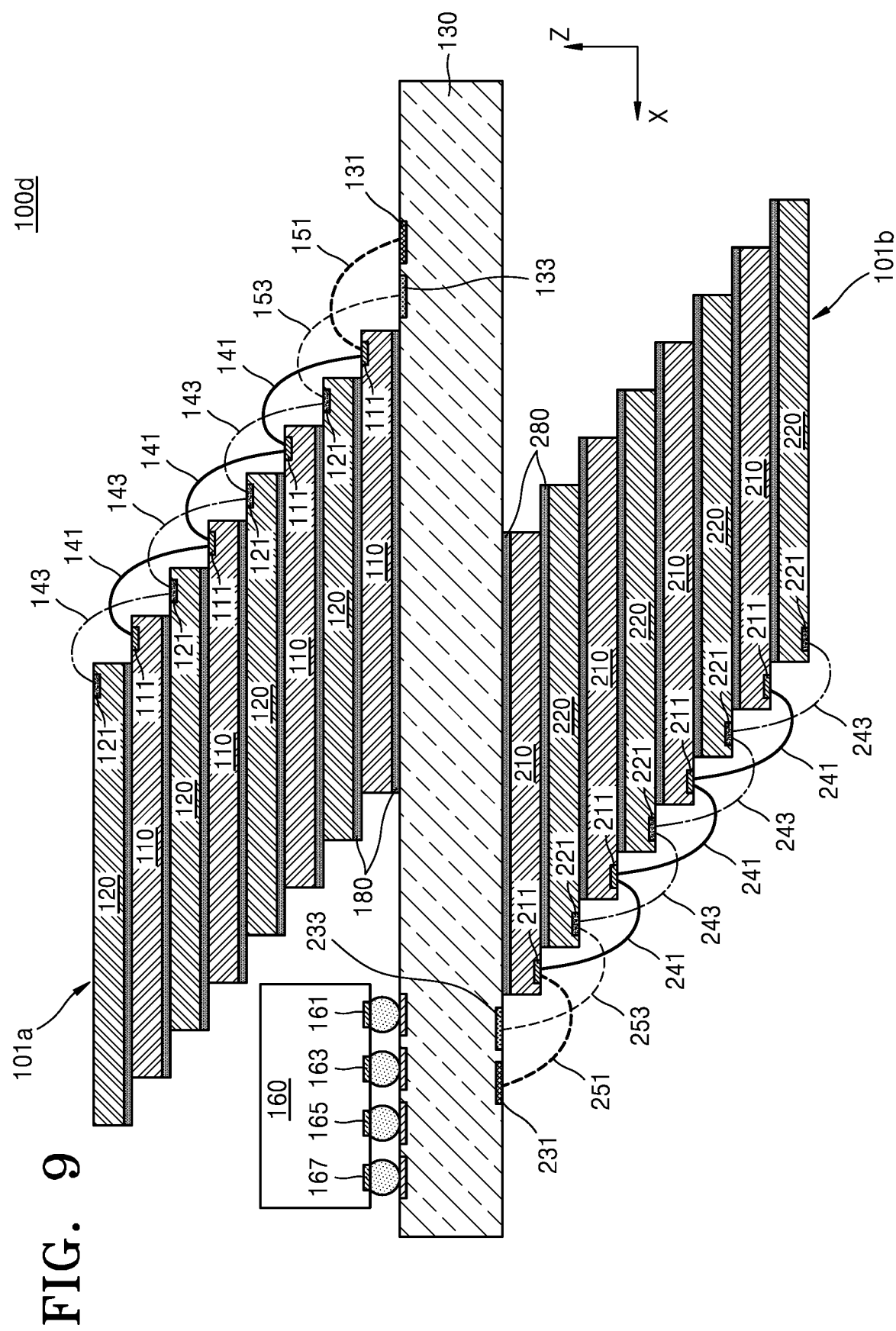
FIG. 9 is a cross-sectional view of a semiconductor package, according to an example embodiment of the inventive concept.
Figure 10:
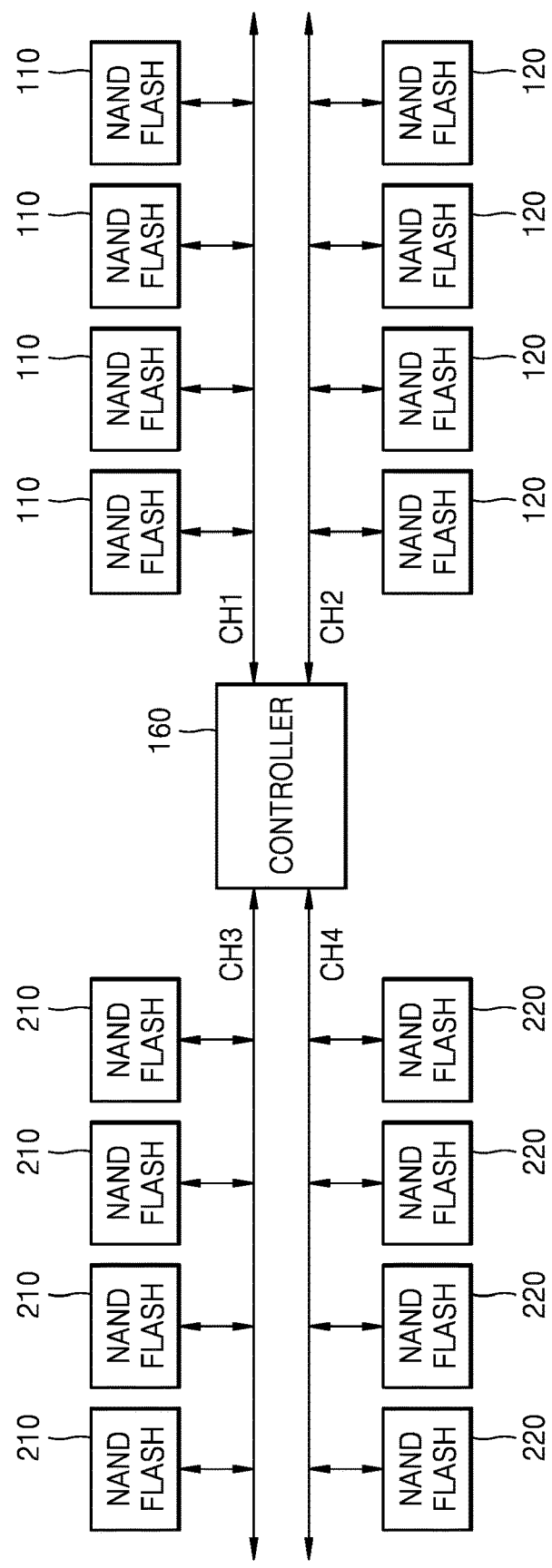
FIG. 10 is a block diagram illustrating main components of the semiconductor package of FIG. 9.

FIG. 9 is a cross-sectional view of a semiconductor package 100d, according to an example embodiment of the inventive concept. FIG. 10 is a block diagram illustrating main components of the semiconductor package 100d of FIG. 9. For convenience of explanation, descriptions that are the same as those given above will be omitted or briefly given.

Referring to FIGS. 9 and 10, the semiconductor package 100d may include the package substrate 130, a first chip stack 101a, a second chip stack 101b, and the controller 160.

The first chip stack 101a may include a plurality of semiconductor chips stacked in the vertical direction on the upper surface of the package substrate 130 by using adhesion members 180. The first chip stack 101a may include first semiconductor chips 110 located on odd layers from among the plurality of semiconductor chips, and second semiconductor chips 120 located on even layers from among the plurality of semiconductor chips. The first chip channel pads 111 of the first semiconductor chips 110 may be electrically connected to each other via the first inter-chip connection wires 141, and the first chip channel pads 111 of the first semiconductor chip 110 located on the lowest layer from among the first semiconductor chips 110 may be electrically connected to the first substrate channel pads 131 of the package substrate 130 via the first substrate-chip connection wires 151. The second chip channel pads 121 of the second semiconductor chips 120 may be electrically connected to each other via the second inter-chip connection wires 143, and the second chip channel pads 121 of the second semiconductor chip 120 located on the lowest layer from among the second semiconductor chips 120 may be electrically connected to the second substrate channel pads 133 of the package substrate 130 via the second substrate-chip connection wires 153. The first chip common pads 115 (see FIG. 1) of the first semiconductor chips 110 and the second chip common pads 125 (see FIG. 1) of the second semiconductor chips 120 may be electrically connected to each other via the third inter-chip connection wires 145 (see FIG. 1), and the first chip common pads 115 of the first semiconductor chip 110 located on the lowest layer from among the first semiconductor chips 110 may be electrically connected to the substrate common pads 135 (see FIG. 1) of the package substrate 130 via the third substrate-chip connection wires 155 (see FIG. 1). The first semiconductor chips 110 and the second semiconductor chips 120 included in the first chip stack 101a, the first inter-chip connection wires 141, the second inter-chip connection wires 143, the third inter-chip connection wires 145, the first substrate-chip connection wires 151, the second substrate-chip connection wires 153, and the third substrate-chip connection wires 155 may be substantially the same as those described above with reference to FIGS. 1 through 4.

The second chip stack 101b may include a plurality of semiconductor chips stacked in the vertical direction on the lower surface of the package substrate 130 by using adhesion members 280.

The second chip stack 101b may include third semiconductor chips 210 located on odd layers from among the plurality of semiconductor chips, and fourth semiconductor chips 220 located on even layers from among the plurality of semiconductor chips. The second chip stack 101b may be substantially the same as or similar to the chip stack 101 described above with reference to FIGS. 1 through 4.

The third semiconductor chips 210 may include third chip channel pads 211 and third chip common pads. The third chip channel pads 211 of the third semiconductor chips 210 may be electrically connected to each other via fourth inter-chip connection wires 241, and the third chip channel pads 211 of a third semiconductor chip 210 located on the lowest layer from among the third semiconductor chips 210 may be electrically connected to third substrate channel pads 231 of the package substrate 130 via fourth substrate-chip connection wires 251. The third semiconductor chips 210 may be connected to the same channel. The third semiconductor chips 210, the fourth inter-chip connection wires 241, and the fourth substrate-chip connection wires 251 may be substantially the same as or similar to the first semiconductor chips 110, the first inter-chip connection wires 141, and the first substrate-chip connection wires 151 described above with reference to FIGS. 1 through 4, respectively.

The fourth semiconductor chips 220 may include fourth chip channel pads 221 and fourth chip common pads. The fourth chip channel pads 221 of the fourth semiconductor chips 220 may be electrically connected to each other via fifth inter-chip connection wires 243, and the fourth chip channel pads 221 of a fourth semiconductor chip 220 located on the lowest layer from among the fourth semiconductor chips 220 may be electrically connected to fourth substrate channel pads 233 of the package substrate 130 via fifth substrate-chip connection wires 253. The fourth semiconductor chips 220 may be connected to the same channel. The fourth semiconductor chips 220, the fifth inter-chip connection wires 243, and the fifth substrate-chip connection wires 253 may be substantially the same as or similar to the second semiconductor chips 120, the second inter-chip connection wires 143, and the second substrate-chip connection wires 153 described above with reference to FIGS. 1 through 4, respectively.

The third chip common pads of the third semiconductor chips 210 and the fourth chip common pads of the fourth semiconductor chips 220 may be electrically connected to each other via sixth inter-chip connection wires, and the third chip common pads of the third semiconductor chip 210 located on the lowest layer from among the third semiconductor chips 210 may be electrically connected to substrate common pads provided on the lower surface of the package substrate 130 via sixth substrate-chip connection wires. The sixth inter-chip connection wires and the sixth substrate-chip connection wires may be substantially the same as or similar to the third inter-chip connection wires 145 and the third substrate-chip connection wires 155 described above with reference to FIGS. 1 through 4, respectively. The third semiconductor chips 210 and the fourth semiconductor chips 220 may be configured to receive a power supply voltage or a ground voltage through the sixth substrate-chip connection wires and the sixth inter-chip connection wires.

The controller 160 may have four channels separated from each other. For example, two channels of the controller 160 may be connected to the first chip stack 101a, and the remaining two channels of the controller 160 may be connected to the second chip stack 101b.

For example, a first channel CH1 of the controller 160 may be connected to the first semiconductor chips 110 included in the first chip stack 101a, a second channel CH2 of the controller 160 may be connected to the second semiconductor chips 120 included in the first chip stack 101a, a third channel CH3 of the controller 160 may be connected to the third semiconductor chips 210 included in the second chip stack 101b, and a fourth channel CH4 of the controller 160 may be connected to the fourth semiconductor chips 220 included in the second chip stack 101b. The controller 160 may provide a first channel signal, a second channel signal, a third channel signal, and a fourth channel signal to the first semiconductor chips 110, the second semiconductor chips 120, the third semiconductor chips 210, and the fourth semiconductor chips 220, respectively, through the four separate channels. For example, each of the first through fourth channel signals may include an I/O signal, a DQS signal, a CE signal, an RE signal, a WE signal, a CLE signal, an ALE signal, an R/B signal, or the like.

According to exemplary embodiments, the controller 160 may be electrically connected to the first, second, third, and fourth semiconductor chips 110, 120, 210, and 220 through separate electrical paths. For example, a first pad 161 of the controller 160 may be electrically connected to a first substrate channel pad 131 of the package substrate 130 through a first interconnection path within the package substrate 130, a second pad 163 of the controller 160 may be electrically connected to a second substrate channel pad 133 of the package substrate 130 through a second interconnection path within the package substrate 130, a third pad 165 of the controller 160 may be electrically connected to a third substrate channel pad 231 of the package substrate 130 through a third interconnection path within the package substrate 130, and a fourth pad 167 of the controller 160 may be electrically connected to a fourth substrate channel pad 233 of the package substrate 130 through a fourth interconnection path within the package substrate 130.

For example, the first channel signal provided to the first pad 161 of the controller 160 may be provided to the first semiconductor chips 110 via the first interconnection path within the package substrate 130, the first substrate-chip connection wire 151, and the first inter-chip connection wires 141. The second channel signal provided to the second pad 163 of the controller 160 may be provided to the second semiconductor chips 120 via the second interconnection path within the package substrate 130, the second substrate-chip connection wire 153, and the second inter-chip connection wires 143. The third channel signal provided to the third pad 165 of the controller 160 may be provided to the third semiconductor chips 210 via the third interconnection path within the package substrate 130, the fourth substrate-chip connection wire 251, and the fourth inter-chip connection wires 241. The fourth channel signal provided to the fourth pad 167 of the controller 160 may be provided to the fourth semiconductor chips 220 via the fourth interconnection path within the package substrate 130, the fifth substrate-chip connection wire 253, and the fifth inter-chip connection wires 243.

Figure 11:
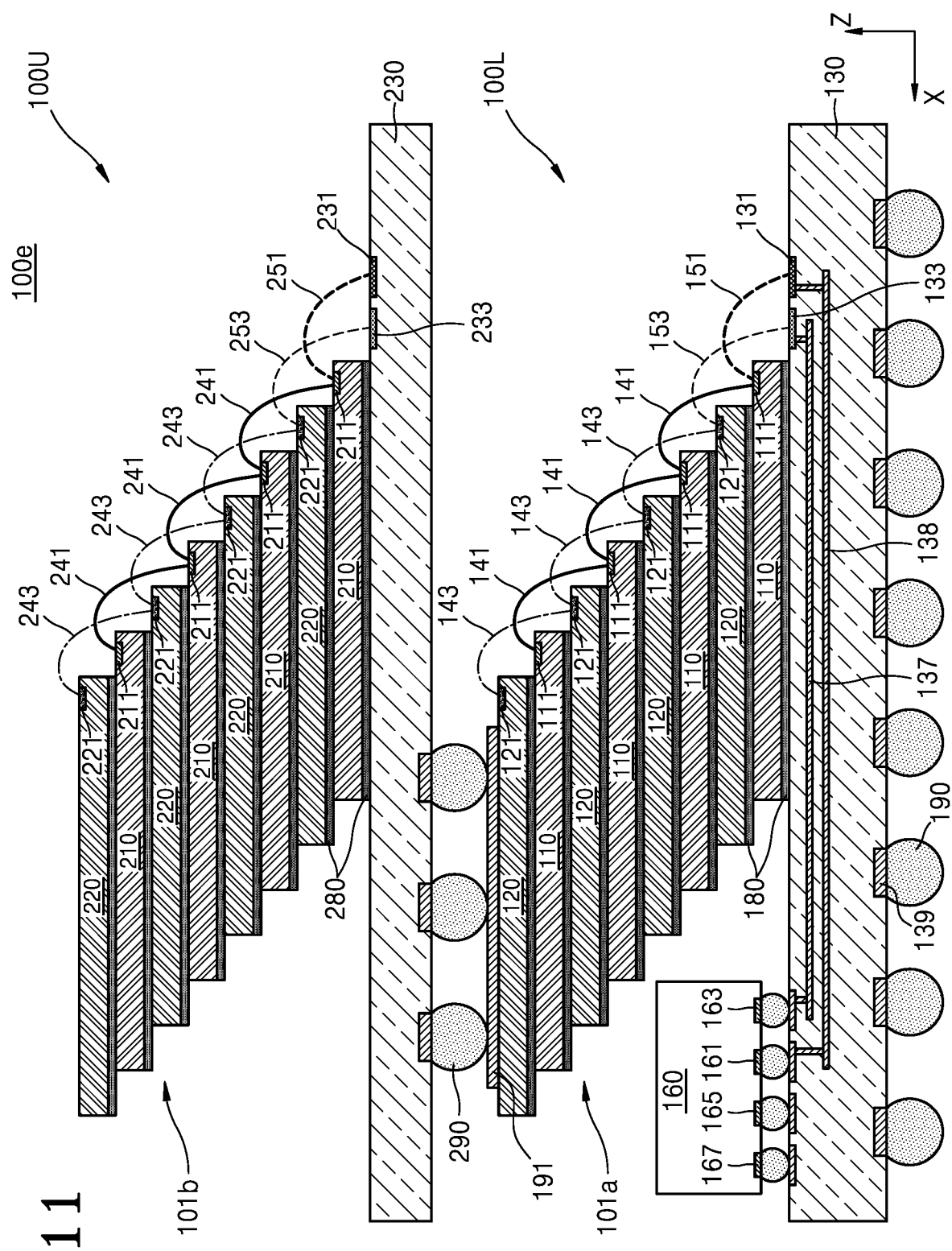
FIG. 11 is a cross-sectional view of a semiconductor package, according to an example embodiment of the inventive concept.

FIG. 11 is a cross-sectional view of a semiconductor package 100e, according to an example embodiment of the inventive concept. For convenience of explanation, descriptions that are the same as those given above will be omitted or briefly given.

Referring to FIG. 11, the semiconductor package 100e may be a package-on-package-type semiconductor package in which an upper semiconductor package 100U is stacked on a lower semiconductor package 100L.

The lower semiconductor package 100L may include the package substrate 130, the first chip stack 101a including the first semiconductor chips 110 and the second semiconductor chips 120, the controller 160, the first inter-chip connection wires 141, the second inter-chip connection wires 143, the third inter-chip connection wires, the first substrate-chip connection wire 151, the second substrate-chip connection wire 153, and the third substrate-chip connection wire 155. The lower semiconductor package 100L may have a substantially similar structure to the semiconductor package 100c described above with reference to FIG. 8.

However, the lower semiconductor package 100L may further include a redistribution pattern 191 on a semiconductor chip existing on the highest layer from among the plurality of semiconductor chips. The redistribution pattern 191 may be electrically connected to the controller 160, at least one of the semiconductor chips included in the first chip stack 101a, or the package substrate 130 through an electrical connection member.

The upper semiconductor package 100U may include an upper package substrate 230, the second chip stack 101b including the third semiconductor chips 210 and the fourth semiconductor chips 220, the fourth inter-chip connection wires 241, the fifth inter-chip connection wires 243, the sixth inter-chip connection wires, the fourth substrate-chip connection wire 251, the fifth substrate-chip connection wire 253, and the sixth substrate-chip connection wire. The upper package substrate 230 may be electrically connected to the redistribution pattern 191 of the lower semiconductor package 100L through inter-package connection bumps 290.

The second chip stack 101b, and the third semiconductor chips 210 and the fourth semiconductor chips 220 included in the second chip stack 101b may be substantially the same as or similar to those of the semiconductor package 100d described above with reference to FIGS. 9 and 10.

The third chip channel pads 211 of the third semiconductor chips 210 may be electrically connected to each other via fourth inter-chip connection wires 241, and the third chip channel pads 211 of a third semiconductor chip 210 located on the lowest layer from among the third semiconductor chips 210 may be electrically connected to third substrate channel pads 231 of the upper package substrate 230 via fourth substrate-chip connection wires 251. The third semiconductor chips 210 may be connected to the same channel.

According to exemplary embodiments, a signal provided by the controller 160 may be transmitted to the third semiconductor chips 210 via the redistribution pattern 191, the inter-package connection bumps 290, the upper package substrate 230, the fourth substrate-chip connection wire 251, and the fourth inter-chip connection wires 241.

The fourth chip channel pads 221 of the fourth semiconductor chips 220 may be electrically connected to each other via fifth inter-chip connection wires 243, and the fourth chip channel pads 221 of a fourth semiconductor chip 220 located on the lowest layer from among the fourth semiconductor chips 220 may be electrically connected to fourth substrate channel pads 233 of the package substrate 130 via fifth substrate-chip connection wires 253. The fourth semiconductor chips 220 may be connected to the same channel.

According to exemplary embodiments, a signal provided by the controller 160 may be transmitted to the third semiconductor chips 210 via the redistribution pattern 191, the inter-package connection bumps 290, the upper package substrate 230, the fifth substrate-chip connection wire 253, and the fifth inter-chip connection wires 243.

The third chip common pads of the third semiconductor chips 210 and the fourth chip common pads of the fourth semiconductor chips 220 may be electrically connected to each other via sixth inter-chip connection wires, and the third chip common pads of the third semiconductor chip 210 located on the lowest layer from among the third semiconductor chips 210 may be electrically connected to substrate common pads of the upper package substrate 230 via sixth substrate-chip connection wires. An externally-received power supply voltage or ground voltage may be transmitted to the third semiconductor chips 210 and the fourth semiconductor chips 220 through the redistribution pattern 191, the inter-package connection bumps 290, the upper package substrate 230, the sixth substrate-chip connection wire, and the sixth inter-chip connection wires.

The controller 160 may have four channels separated from each other, similar to that described above with reference to FIGS. 9 and 10, and may be configured to transmit different channel signals to the first, second, third, and fourth semiconductor chips 110, 120, 210, and 220 through the four channels.

While the inventive concept has been particularly shown and described with reference to embodiments thereof, it will be understood that various changes in form and details may be made therein without departing from the spirit and scope of the following claims.

What is claimed is:

1. A semiconductor package comprising:
   a package substrate comprising a first substrate channel pad and a second substrate channel pad;
   a chip stack comprising a plurality of semiconductor chips stacked on the package substrate to be offset in a first direction, wherein first semiconductor chips located on odd layers from among the plurality of semiconductor chips and second semiconductor chips located on even layers from among the plurality of semiconductor chips are offset in a second direction perpendicular to the first direction, each of the first semiconductor chips comprising a first chip channel pad, and each of the second semiconductor chips comprising a second chip channel pad;
   first inter-chip connection wires configured to electrically connect the first chip channel pads of the first semiconductor chips to one another;
   second inter-chip connection wires configured to electrically connect the second chip channel pads of the second semiconductor chips to one another;
   a first substrate-chip connection wire configured to connect the first chip channel pad of a first semiconductor chip located on a lowest layer from among the first semiconductor chips to the first substrate channel pad; and
   a second substrate-chip connection wire configured to connect the second chip channel pad of a second semiconductor chip located on a lowest layer from among the second semiconductor chips to the second substrate channel pad.

2. The semiconductor package of claim 1, wherein, from a planar view, the first chip channel pads of the first semiconductor chips are aligned in the first direction, and the second chip channel pads of the second semiconductor chips are aligned in the first direction.

3. The semiconductor package of claim 2, wherein, from a planar view, the first chip channel pads of the first semiconductor chips are spaced apart from the second chip channel pads of the second semiconductor chips in the first and second directions.

4. The semiconductor package of claim 1, further comprising:
   a controller comprising a first channel and a second channel separated from each other,
      wherein the first channel of the controller is electrically connected to the first chip channel pads of the first semiconductor chips through the first substrate-chip connection wire and the first inter-chip connection wires, and
      wherein the second channel of the controller is electrically connected to the second chip channel pads of the second semiconductor chips through the second substrate-chip connection wire and the second inter-chip connection wires.

5. The semiconductor package of claim 4,
   wherein the first chip channel pads of the first semiconductor chips comprise at least one of an input/output (I/O) pad, a data strobe signal (DQS) pad, a chip enable (CE) pad, a read enable (RE) pad, a write enable (WE) pad, a command latch enable (CLE) pad, an address latch enable (ALE) pad, and a ready/busy (RB) pad, and
   wherein the second chip channel pads of the second semiconductor chips comprise at least one of an I/O pad, a DQS pad, a CE pad, an RE pad, a WE pad, a CLE pad, an ALE pad, and an RB pad.

6. The semiconductor package of claim 1,
   wherein the package substrate comprises a common substrate pad,
   wherein each of the first semiconductor chips comprises a first common pad,
   wherein each of the second semiconductor chips comprises a second common pad, and
   wherein the semiconductor package further comprises:
      third inter-chip connection wires configured to electrically connect the first common pads of the first semiconductor chips to the second common pads of the second semiconductor chips; and
      a third substrate-chip connection wire configured to electrically connect the first common pad of the first semiconductor chip located on the lowest layer from among the first semiconductor chips to the common substrate pad.

7. The semiconductor package of claim 6,
   wherein the first common pads of the first semiconductor chips comprise at least one of a Vcc pad and a Vss pad, and
   wherein the second common pads of the second semiconductor chips comprise at least one of a Vcc pad and a Vss pad.

8. The semiconductor package of claim 7,
   wherein, from a planar view, the first common pads of the first semiconductor chips are arranged side by side in the first direction, and the second common pads of the second semiconductor chips are arranged side by side in the first direction, and
   wherein from a planar view, the first common pads of the first semiconductor chips are spaced apart from the second common pads of the second semiconductor chips in the second direction.

9. The semiconductor package of claim 6,
   wherein each of the first semiconductor chips has a pad arrangement in which two first chip channel pads are spaced apart from each other with one first common pad between the two first chip channel pads, and
   wherein each of the second semiconductor chips has a pad arrangement in which two second chip channel pads are spaced apart from each other with one second common pad between the two second chip channel pads.

10. The semiconductor package of claim 1, wherein a distance by which the plurality of semiconductor chips are offset in the first direction is about 230 μm to about 400 μm.

19

11. The semiconductor package of claim 1,
wherein each of the first semiconductor chips comprises a plurality of first chip channel pads arranged along one edge of the first semiconductor chip, wherein each of the second semiconductor chips comprises a plurality of second chip channel pads arranged along one edge of the second semiconductor chip, and
wherein an interval between the plurality of first chip channel pads is equal to an interval between the plurality of second chip channel pads.

12. The semiconductor package of claim 11, wherein the interval between the plurality of first chip channel pads and the interval between the plurality of second chip channel pads are greater than a distance by which the first semiconductor chips and the second semiconductor chips are offset in the second direction.

13. The semiconductor package of claim 1, wherein each of the plurality of semiconductor chips includes a NAND flash memory.

14. The semiconductor package of claim 1, wherein each of the first inter-chip connection wires is configured to connect two first semiconductor chips spaced apart from each other with one second semiconductor chip between the two first semiconductor chips.

15. A semiconductor package comprising:
a package substrate comprising a common substrate pad, a first substrate channel pad, and a second substrate channel pad;
a plurality of semiconductor chips stacked on the package substrate to be offset in a first direction, each of the plurality of semiconductor chips comprising a common pad and a channel pad;
first inter-chip connection wires configured to electrically connect the channel pads of semiconductor chips located on odd layers from among the plurality of semiconductor chips to one another;
second inter-chip connection wires configured to electrically connect the channel pads of semiconductor chips located on even layers from among the plurality of semiconductor chips to one another;
third inter-chip connection wires configured to electrically connect the common pads of the plurality of semiconductor chips to one another;
a first substrate-chip connection wire configured to electrically connect the channel pad of a semiconductor chip located on a lowest layer from among the semiconductor chips located on the odd layers to the first substrate channel pad;
a second substrate-chip connection wire configured to electrically connect the channel pad of a semiconductor chip located on a lowest layer from among the semiconductor chips located on the even layers to the second substrate channel pad;
a third substrate-chip connection wire configured to electrically connect the common pad of the semiconductor chip located on the lowest layer from among the semiconductor chips located on the odd layers to the common substrate pad; and
a controller mounted on the package substrate and comprising a first channel and a second channel separated from each other,
wherein the first channel of the controller is electrically connected to the semiconductor chips located on the odd layers through the first substrate-chip connection wire and the first inter-chip connection wires, and
wherein the second channel of the controller is electrically connected to the semiconductor chips located on the even layers through the second substrate-chip connection wire and the second inter-chip connection wires.

16. The semiconductor package of claim 15,
wherein a number of first inter-chip connection wires is equal to a number obtained by subtracting 1 from a total number of the semiconductor chips located on the odd layers,
wherein a number of second inter-chip connection wires is equal to a number obtained by subtracting 1 from a total number of the semiconductor chips located on the even layers, and
wherein a number of third inter-chip connection wires is equal to a number obtained by subtracting 1 from a total number of the plurality of semiconductor chips.

17. The semiconductor package of claim 15, wherein each of the first inter-chip connection wires extends in the first direction, and each of the second inter-chip connection wires extends in the first direction.

18. The semiconductor package of claim 15, wherein the channel pads of the semiconductor chips located on the odd layers are spaced apart from the channel pads of the semiconductor chips located on the even layers in the first direction and the second direction perpendicular to the first direction.

19. The semiconductor package of claim 15,
wherein the channel pads of the plurality of semiconductor chips correspond to input/output (I/O) pads, data strobe signal (DQS) pads, chip enable (CE) pads, read enable (RE) pads, write enable (WE) pads, command latch enable (CLE) pads, address latch enable (ALE) pads, or ready/busy (RB) pads, and
wherein the common pads of the plurality of semiconductor chips correspond to Vcc pads or Vss pads.

20. A semiconductor package comprising:
a package substrate comprising a common substrate pad, a first substrate channel pad, and a second substrate channel pad;
a plurality of semiconductor chips stacked on the package substrate in a vertical direction, each of the plurality of semiconductor chips comprising a common pad and a channel pad;
first inter-chip connection wires configured to electrically connect the channel pads of semiconductor chips located on odd layers from among the plurality of semiconductor chips to one another;
second inter-chip connection wires configured to electrically connect the channel pads of semiconductor chips located on even layers from among the plurality of semiconductor chips to one another;
third inter-chip connection wires configured to electrically connect the common pads of the plurality of semiconductor chips to one another;
a first substrate-chip connection wire configured to connect the channel pad of a semiconductor chip located on a lowest layer from among the semiconductor chips located on the odd layers to the first substrate channel pad;
a second substrate-chip connection wire configured to connect the channel pad of a semiconductor chip located on a lowest layer from among the semiconductor chips located on the even layers to the second substrate channel pad;
a third substrate-chip connection wire configured to electrically connect the common pad of the semiconductor chip located on the lowest layer from among the semiconductor chips located on the odd layers to the common substrate pad; and a controller mounted on the package substrate, electrically connected to the semiconductor chips located on the odd layers through the first substrate-chip connection wire and the first inter-chip connection wires, and electrically connected to the semiconductor chips located on the even layers through the second substrate-chip connection wire and the second inter-chip connection wires, wherein a number of first inter-chip connection wires is equal to a number obtained by subtracting 1 from a total number of the semiconductor chips located on the odd layers, wherein a number of second inter-chip connection wires is equal to a number obtained by subtracting 1 from a total number of the semiconductor chips located on the even layers, and wherein a number of third inter-chip connection wires is equal to a number obtained by subtracting 1 from a total number of the plurality of semiconductor chips.

* * * * *